(12) United States Patent
Tsukahara et al.

(10) Patent No.: US 7,381,902 B2
(45) Date of Patent: Jun. 3, 2008

(54) WIRING BOARD AND METHOD OF MANUFACTURING THE SAME

(75) Inventors: Norihito Tsukahara, Kyoto (JP); Kazuhiro Nishikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 313 days.

(21) Appl. No.: 10/951,620

(22) Filed: Sep. 29, 2004

(65) Prior Publication Data

US 2005/0087363 A1 Apr. 28, 2005

(30) Foreign Application Priority Data

Oct. 1, 2003 (JP) ............................. 2003-343018
Oct. 1, 2003 (JP) ............................. 2003-343019

(51) Int. Cl.
*H05K 1/09* (2006.01)
(52) U.S. Cl. ...................................... 174/257; 361/751
(58) Field of Classification Search ............... 174/257; 361/751, 765, 766, 779
See application file for complete search history.

(56) References Cited

U.S. PATENT DOCUMENTS 4,698,494 A * 10/1987 Kato et al. ............... 250/214.1
6,894,890 B2 * 5/2005 Takatani et al. ............ 361/532

FOREIGN PATENT DOCUMENTS

| JP | 54-103580 | 8/1979 |
| JP | 58-134496 | 8/1983 |
| JP | 2-027791 | 1/1990 |
| JP | 07-45369 | * 2/1995 |
| JP | 9-289361 | 11/1997 |
| JP | 2000-307207 | 11/2000 |
| JP | 2003-209338 | 7/2003 |
| JP | 2005-174698 | * 6/2005 |

* cited by examiner

*Primary Examiner*—Jeremy C Norris
(74) *Attorney, Agent, or Firm*—Wenderoth, Lind & Ponack, L.L.P.

(57) ABSTRACT

A wiring board comprises a patterned wiring formed of electrically conductive resin composed primarily of silver and embedded into a substrate in a manner that a surface thereof is exposed above the substrate, and a covering conductor formed primarily of carbon covering the surface of the patterned wiring. The wiring board of this structure is superior in resistance to moisture absorption and water, prevents silver migration attributable to the moisture, and reduces contact resistance in the connection between a terminal portion of the wiring board and an external apparatus.

5 Claims, 5 Drawing Sheets

WIRING BOARD AND METHOD OF MANUFACTURING THE SAME

BACKGROUND OF THE INVENTION

1. Field of the Invention

The present invention relates to a wiring board comprising a patterned wiring formed of conductive resin mainly composed of silver on a substrate. The invention also relates to a method of manufacturing the wiring board.

2. Background Art

A wiring board hitherto known has a patterned wiring composed of silver paste formed on a substrate by using a printing method such as screen printing. However, the patterned wiring formed of silver paste has a drawback that silver in the patterned wiring migrates and a resistance of a wiring conductor changes when it is wet with absorption of moisture or adhesion of water, or when there is an electric field. This is because the silver is prone to migrate as compared with other electrically conductive metals although it is an excellent conductive metal having low electrical resistance. For this reason, there have been heretofore proposed numerous ideas to prevent the silver migration. Since electrodes of a terminal portion need to be exposed for connection of the wiring board with an external apparatus, silver migration tends to occur especially in the terminal portion. Prevention of the migration is therefore desired strongly for the terminal portion.

In the case of using ordinary paste made of conductive resin containing silver particles, a finished patterned wiring has a considerably asperate surface after the paste is printed and hardened. It therefore has a problem that contact resistance can not be made small in a structure in which the wiring board is connected to an external apparatus through mechanical contact of the terminal portion.

A structure shown in FIG. 8 is disclosed in Japanese Patent Laid-open Publication, No. 2000-307207, as an example of a wiring board structure contrived to prevent silver migration. FIG. 8 is a perspective view showing a terminal configuration of a conventional wiring board for connection with an external apparatus. Each of terminal portions 200 comprises silver paste layer 220 made of silver paste printed on a surface of plastic film 210, and carbon paste layer 230 made of carbon paste printed thereon. A portion of plastic film 210 is cut off between terminal portions 200 to facilitate the connection. In addition, protective film 240 is formed on top of carbon paste layer 230 in an area other than terminal portions 200. Accordingly, silver migration due to moisture absorption or adhesion of water is prevented by this double-layered structure in which silver paste layer 220 is covered with lamination of carbon paste layer 230 which is not likely to migrate easily.

There is also a method of reducing contact resistance in the connecting portion such as the method disclosed in Japanese Patent Laid-open Publication, No. S58-134496, for example. That is, a surface of a patterned wiring formed of silver paste printed on a substrate such as a plastic film is smoothed by means of rolling or buffing to increase a contact area and decrease the contact resistance.

However, in the case of this double-layered structure in which the carbon paste layer is formed on the silver paste layer, side surfaces of the silver paste layer are not covered with the carbon paste layer. Because the silver paste layer is exposed at the side surfaces, this structure is unable to positively prevent the silver migration from the side surfaces. This structure also has an additional problem that formation of the patterned wiring of fine pitches is practically inhibitive, since the narrower a distance between conductors of the patterned wiring the more intense it becomes in the strength of the electrical field, which promotes the silver to migrate. Besides, the above publication does not make any reference to use of carbon paste for smoothing out asperities in a surface of the silver paste layer.

The conventional method of smoothing the surface of the silver paste layer by using a roller and the like is effective for reduction of contact resistance in the connection between the terminal portion of the patterned wiring and an external apparatus. However, it also has a problem that it is unable to prevent a failure caused by the silver migration because it is not provided with any measures to protect against the silver migration.

SUMMARY OF THE INVENTION

A wiring board of the present invention has a structure comprising:

a substrate;

a patterned wiring formed of conductive resin containing silver particles, the patterned wiring being embedded into the substrate in a manner that at least an upper surface thereof is exposed above the substrate, and the upper surface having a smooth texture; and a covering conductor formed of conductive resin containing carbon in a manner to cover the exposed surface of the patterned wiring.

Another wiring board of the present invention has a structure comprising:

a substrate;

a patterned wiring formed of conductive resin containing silver particles on the substrate; and a covering conductor formed of conductive resin containing carbon particles of a diameter smaller than the silver particles, the covering conductor covering an exposed surface of the patterned wiring, and the upper surface having a smooth texture.

Furthermore, a method of manufacturing a wiring board according to the present invention comprises:

forming a patterned wiring with conductive resin containing silver particles on a substrate;

embedding the patterned wiring into the substrate partly or up to a depth generally equivalent to a thickness of the patterned wiring, and smoothing an upper surface of the patterned wiring by pressing the patterned wiring against the substrate while heating the substrate at the same time; and forming a covering conductor with conductive resin containing carbon in a manner to cover an exposed surface of the patterned wiring embedded in the substrate.

Another method of manufacturing a wiring board according to the present invention comprises:

forming a patterned wiring with conductive resin containing silver particles on a substrate; and forming a covering conductor on the patterned wiring by printing conductive resin containing carbon particles having a diameter smaller than the silver particles by performing a stencil printing process using a stencil having an opening of a shape encompassing the patterned wiring and a thickness larger than the patterned wiring.

DETAILED DESCRIPTION OF THE EXEMPLARY EMBODIMENTS

First Exemplary Embodiment

Referring now to FIG. 1 through FIG. 3C, description will be provided hereinafter of a wiring board according to a first exemplary embodiment of the present invention. In these drawings, the wiring boards are illustrated on an enlarged scale in a direction of their thicknesses to make them more comprehensible.

Figure 1:
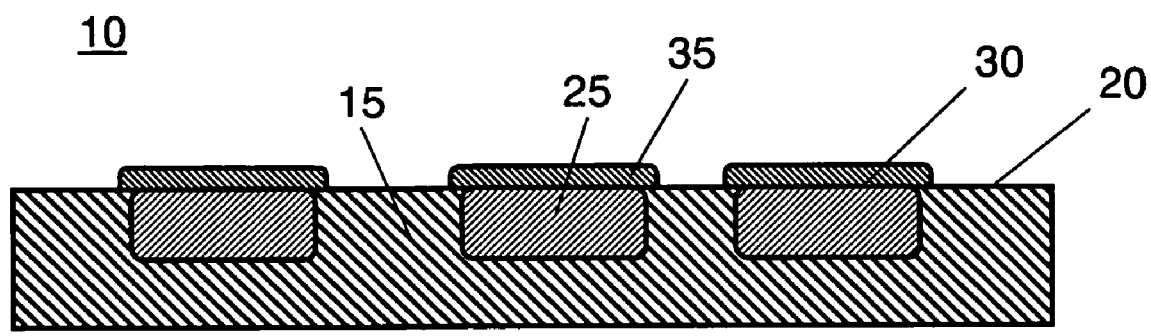
FIG. 1 is a sectional view showing schematically a main part of a wiring board according to a first exemplary embodiment of the present invention.

FIG. 1 is a sectional view schematically showing a main part of the wiring board.

Wiring board 10 is composed of such a structure that patterned wiring 25 of conductive resin containing silver particles is embedded into substrate 15 made of a sheet of thermoplastic resin film by a printing method such as screen printing in a manner to expose only surface 30 of patterned wiring 25. In addition, covering conductor 35 of conductive resin containing carbon is formed on surface 30 of patterned wiring 25. In other words, substrate 15 made of thermoplastic resin is heated, and patterned wiring 25 is pressed against substrate 15 to embed the patterned wiring 25 into softened substrate 15. At the same time, surface 30 of patterned wiring 25 is smoothed by a pressure applied during this embedding process. Covering conductor 35 formed of conductive resin containing carbon covers surface 30 of patterned wiring 25 to complete wiring board 10.

Figure 2:
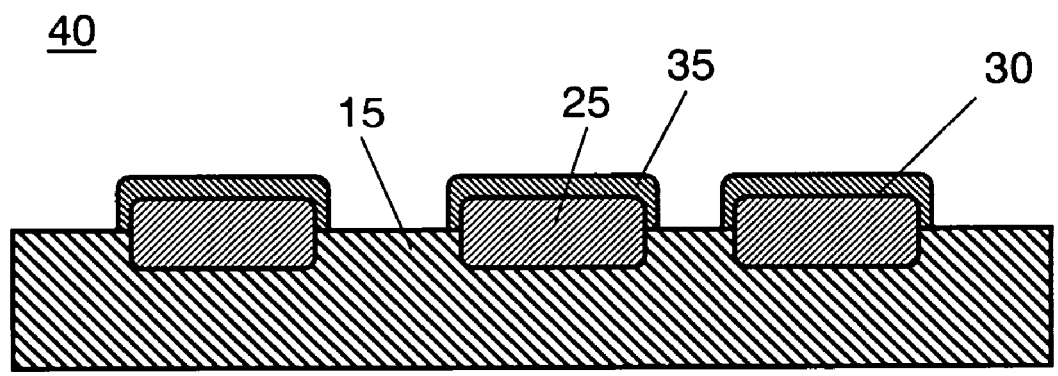
FIG. 2 is a sectional view also showing schematically a main part of a variant form of the wiring board according to the first exemplary embodiment of the present invention.

FIG. 2 is a sectional view illustrating schematically a main part of wiring board 40 which is a variant form of the wiring board according to the first exemplary embodiment of this invention.

In wiring board 40, patterned wiring 25 is embedded partially in a direction of its thickness into substrate 15 by means of heating and pressing. An exposed area of patterned wiring 25 is covered with covering conductor 35 formed of the conductive resin containing carbon. Surface 30 of patterned wiring 25 is smoothed by the heat and pressure applied during the embedding process, in the same manner as that of FIG. 1.

Because of the above structure, the wiring board according to the first exemplary embodiment of this invention has the following features.

First, surface 30 of patterned wiring 25 is smoothed by the process of heating and pressing. This improves a bonding strength between patterned wiring 25 and covering conductor 35, and decreases a contact resistance between patterned wiring 25 and a connector of an external apparatus when a portion of patterned wiring 25 is used as a connecting terminal. Furthermore, the process of heating and pressing not only smoothes surface 30, but also reduces a resistance of patterned wiring 25 at the same time since it compacts the silver particles inside patterned wiring 25.

In addition, it helps to reduce the thickness of covering conductor 35 formed on patterned wiring 25 to cover asperities in the surface, since it smoothes out the asperities of patterned wiring 25. The embodied structure can thus control an increase in electrical resistance attributable to covering conductor 35, and decrease the resistance in connection between the connector of the external apparatus and patterned wiring 25.

Secondly, patterned wiring 25 is embedded into substrate 15, and patterned wiring 25 is covered with covering conductor 35 formed of the conductive resin containing carbon. This structure increases resistance to absorption of moisture and water, and prevents the silver from migrating.

Accordingly, either of the structures of wiring board 10 and wiring board 40 can provide excellent performance as stated above. The structure of wiring board 10 is especially desirable, since it has patterned wiring 25 formed flush with surface 20 of substrate 15, which makes it easy to form covering conductor 35 or an inter-layer insulation film in a process of forming a multi-layered wiring board.

Any material that is thermally deformable is suitable for substrate 15, such as a film sheet of any thermoplastic resin including polyester resin like PET (polyethylene terephthalate), ABS resin (acrylonitrile butadiene styrene), polycarbonate, and the like.

It is desirable to use silver paste having a binding agent mixed dispersively with silver particles of 0.1 μm to 20 μm in diameter, since it is superior in view of printability as the conductive resin containing silver particles. In particular, silver paste of a type that uses such thermosetting resins as polyester resin, epoxy resin, acrylic resin, polyimide resin, polyurethane resin and the like for the binding agent is suitable because it has good bonding strength with substrate 15 made of a film sheet, and it increases a mechanical strength of patterned wiring 25 itself.

It is also desirable to use carbon paste having a binding agent mixed dispersively with electrically conductive carbon such as graphite, acetylene black and the like pulverized to particles of 0.01 μm to 1 μm in diameter, as the conductive resin containing carbon since it is superior for the purpose of preventing silver migration. In particular, carbon paste of a type that uses thermosetting resin such as polyester resin, epoxy resin, acrylic resin, polyimide resin, polyurethane resin and the like for the binding agent is more suitable because of its property of good bonding strength with the silver paste, and outstanding resistance to abrasion. This type of carbon paste has a specific resistance of approximately $1 \times 10^{-1} \Omega \cdot cm$. Therefore, it may be appropriate to use a composite paste having a small amount of silver particles mixed in the carbon paste when necessary to reduce the specific resistance.

Figure 3A:
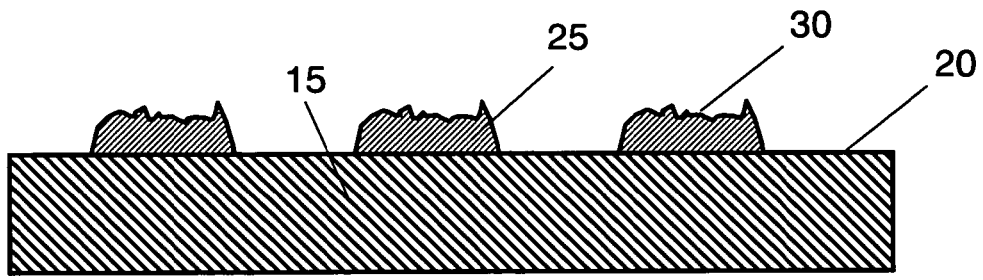
FIGS. 3A, 3B and 3C are sectional views of a wiring board showing one example of a manufacturing process according to the first exemplary embodiment of the present invention.
Figure 3B:
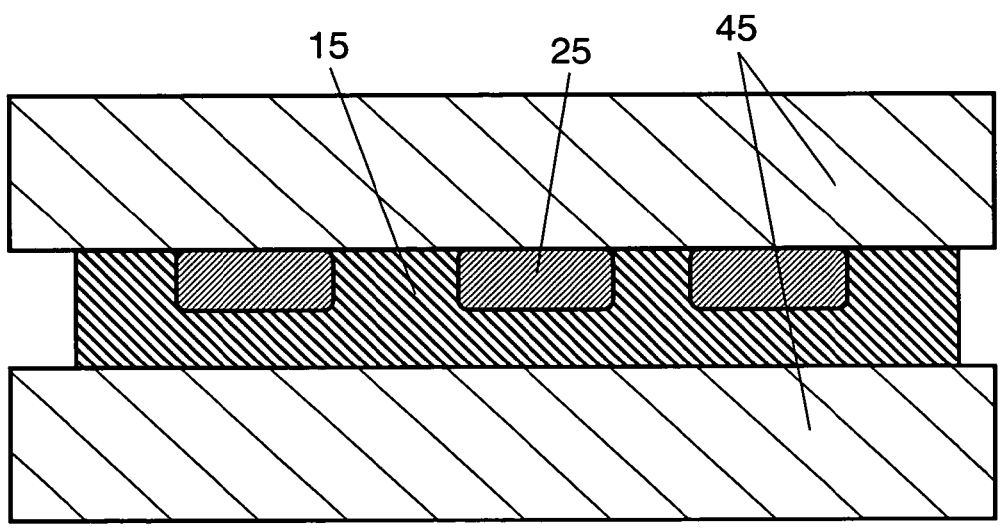
Figure 3C:
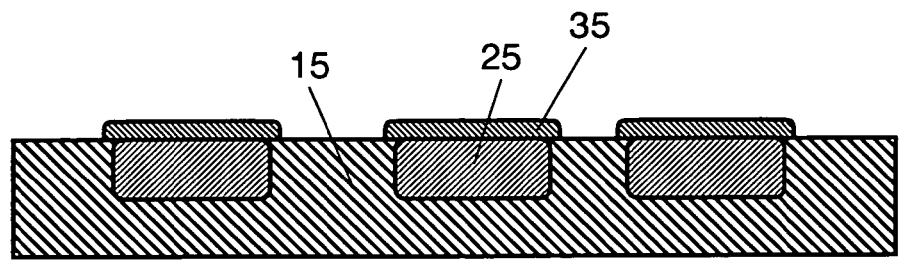

With reference to FIGS. 3A-3C, description is provided hereinafter of a method of manufacturing the wiring board according to this exemplary embodiment of the invention.

FIGS. 3A-3C show sectional views of a wiring board illustrating one example of the manufacturing method. Like reference numerals are used to designate like structural elements as those of FIG. 1 and FIG. 2.

First, patterned wiring 25 formed of silver paste is printed on surface 20 of substrate 15 by using a printing method such as screen printing and photogravure, as shown in FIG. 3A (this process is called a patterned wiring forming step). Patterned wiring 25 becomes a low-resistance body when hardened by heat. In this step, a variety of printing methods can be used other than the methods discussed above. Among those, the screen printing method is especially desirable in views of high flexibility in the formation of patterned wiring 25, outstanding mass-productivity, and low manufacturing cost.

During this forming step, there develops asperities of several μm to several tens of μm at least in surface 30 of patterned wiring 25 opposite the side bonded to substrate 15, as shown in FIG. 3A. They develop because of shapes of the silver particles contained in the silver paste and the influence of screen mesh patterns during the screen printing.

Next, substrate 15 formed with patterned wiring 25 is heated to a softening temperature or higher and pressed at the same time by using press machine 45 capable of heating and pressing, as shown in FIG. 3B. This pushes patterned wiring 25 into embedment in softened substrate 15 (this process is called a patterned wiring embedding step). As a result of the heating and pressing, patterned wiring 25 is embedded to an extent that its surface 30 becomes flush with surface 20 of substrate 15, while the asperities in surface 30 are smoothed at the same time.

Subsequently, covering conductor 35 of conductive resin containing carbon is formed in a manner to cover at least surface 30 of patterned wiring 25, as shown in FIG. 3C, by using any printing method such as screen printing and stencil printing (this process is called a covering conductor forming step).

The above steps complete the wiring board 10 having patterned wiring 25 embedded therein and surface 30 covered with covering conductor 35.

Figure 4:
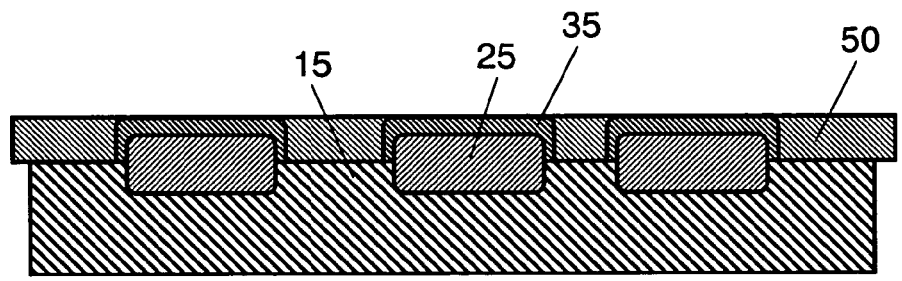
FIG. 4 is a sectional view of a wiring board showing another example of the manufacturing process according to the first exemplary embodiment of the present invention.

In the patterned wiring embedding step, patterned wiring 25 may be embedded only partially in a direction of its thickness into substrate 15. If such is the case, covering conductor 35 formed of the conductive resin containing carbon is printed over a portion of patterned wiring 25 exposed from substrate 15 by using stencil 50 having an opening larger than a width of patterned wiring 25, as shown in FIG. 4. In this case, stencil 50 needs to have a larger thickness than that of patterned wiring 25 protruding from the surface of substrate 15. This printing process completes wiring board 40 shown in FIG. 2, wherein the exposed portion of patterned wiring 25 is covered with covering conductor 35.

Description is provided hereinafter of further details of the method of manufacturing the wiring board based on an example embodied according to this exemplary embodiment of the invention.

In this embodiment, a patterned wiring composed of silver paste was printed on a substrate under the following conditions. Substrate 15 used here was a film of polyethylene terephthalate ("PET") having a thickness of 100 μm and a softening temperature of 130 deg-C. The silver paste used was a paste comprising a mixture of silver particles and a binding agent of thermosetting epoxy having a curing temperature of 120 deg-C., in a ratio of 75 to 15 by weight, wherein the mixed silver particles include spherical particles and scaly particles having diameters ranging between 0.5 μm and 10 μm. A screen printing method was used for printing the silver paste with screen meshes of 25 μm in diameter and a photosensitive emulsion layer of 10 μm in thickness in order to form a patterned wiring having conductors of 150 μm wide. After the printing of the silver paste on surface 20 of substrate 15, it was subjected to the curing process by air-drying and heating to complete formation of patterned wiring 25. Following the formation of patterned wiring 25, substrate 15 was heated and pressed at 130 deg-C. for 10 minutes with press machine 45. Patterned wiring 25 was thus embedded into substrate 15 to such a depth that surface 30 of patterned wiring 25 became flush with surface 20 of substrate 15. At the end of these steps, patterned wiring 25 was 20 μm to 30 μm in thickness, 160 μm to 170 μm in width of a conductor and 2 μm or less in height of asperities of surface 30. In addition, there was no more than 1 μm in difference of flatness between surface 30 of patterned wiring 25 and surface 20 of substrate 15.

Next, carbon paste composed of electrically conductive resin containing carbon was printed over patterned wiring 25 according to the following conditions. The carbon paste used here was a paste comprising electrically conductive carbon particles made of acetylene black having 0.1 μm to 0.3 μm in diameter and a binding agent of thermosetting epoxy resin having 120 deg-C. in curing temperature, in a ratio of 85 to 15 by weight. The stencil printing method was used for printing the carbon paste. A stencil used was 15 μm in thickness. After the carbon paste of conductive resin was printed on patterned wiring 25, the carbon paste was thermally hardened by heating substrate 15 at 130 deg-C. for 10 minutes. This completed wiring board 10, of which patterned wiring 25 is covered with covering conductor 35 formed of the carbon paste. A film thickness of covering conductor 35 measured after the hardening step was 10 μm to 15 μm.

Wiring board 10 manufactured by the above method was evaluated for its reliability according to the following conditions. The evaluation was performed by observing the surface of wiring board 10 left for 1,000 hours in an atmosphere of 65 deg-C. in temperature and 95% in relative humidity while having a voltage applied thereto. As a result, wiring board 10 did not exhibit any trace of silver migration.

Furthermore, a terminal portion for external connection of the patterned wiring was mechanically connected with a terminal of an external apparatus, and a contact resistance was measured. The result showed a reduction of the contact resistance by a factor of about ten as compared with a terminal portion of the conventional structure, indicating that this embodiment can reduce the contact resistance substantially.

In the first exemplary embodiment of this invention, although the wiring board was illustrated as having the covering conductor formed on the entire surface of the patterned wiring, the invention should not be considered limited to this structure. For example, the covering conductor may be formed only in a part of the patterned wiring that serves as the terminal for connection to an external apparatus. When this is the case, an insulation protective film may be formed on a portion of the patterned wiring not covered by the covering conductor to protect it from the migration.

Moreover, although the wiring board was illustrated as being of a single-layer structure in the first exemplary embodiment of this invention, the invention should not be considered limited to this structure. The wiring board can be of a multilayer structure. In this case, a covering conductor composed of the conductive resin containing carbon can be formed over a patterned wiring on the uppermost layer of the wiring board by using the method illustrated in this exemplary embodiment of the invention to achieve a similar advantage.

Second Exemplary Embodiment

Figure 5:
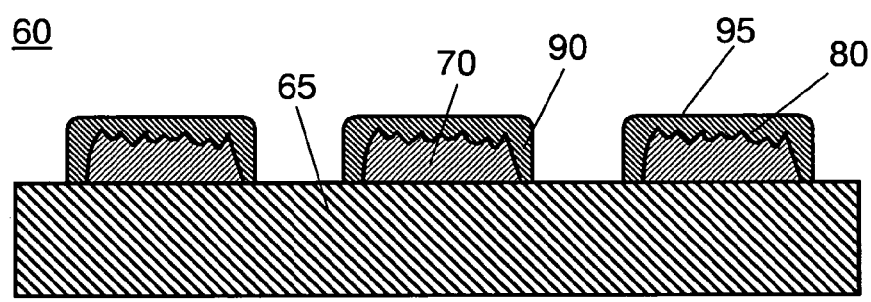
FIG. 5 is a sectional view showing schematically a main part of a wiring board according to a second exemplary embodiment of the present invention.
Figure 6:
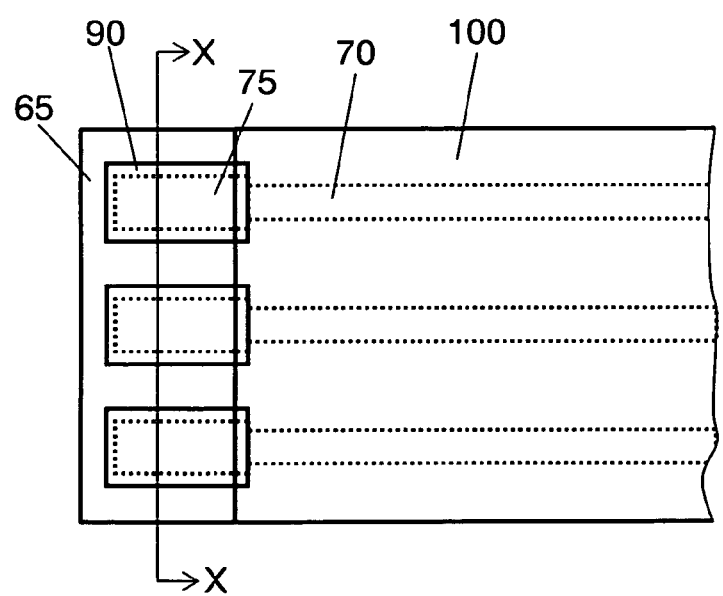
FIG. 6 is a plan view showing only a terminal portion of the wiring board according to the second exemplary embodiment of the present invention.

Referring to FIG. 5 through FIG. 7, description will be provided hereinafter of a wiring board and a method of manufacturing the same according to the second exemplary embodiment of the present invention. In this embodiment, like reference numerals are used to designate like elements as those of the first exemplary embodiment. Although the wiring board illustrated below is a specific example having a terminal portion, this embodiment is to be considered as not restrictive in this and other respects.

FIG. 5 is a sectional view schematically showing a main part of the wiring board.

Wiring board 60 comprises patterned wiring 70 formed on substrate 65 by means of a printing method such as screen printing using silver paste composed of conductive resin containing silver particles, and covering conductor 90 formed on terminal portion 75 of patterned wiring 70 using carbon paste composed of conductive resin containing carbon particles. The carbon paste used here is composed of such conductive resin that contains carbon particles having particle diameters much finer than the silver particles. This carbon paste covers asperities in surface 80 of terminal portion 75 of patterned wiring 70, and forms a smooth texture in surface 95 of covering conductor 90.

FIG. 6 is a plan view of wiring board 60 showing only an area around terminal portion 75. As shown in FIG. 6, covering conductor 90 is formed in such a manner that it covers terminal portion 75 of patterned wiring 70. Besides, insulation protective film 100 is formed over other areas of patterned wiring 70 not covered with the covering conductor 90. This insulation protective film 100 is formed in a manner so that it also covers a part of covering conductor 90. According to the structure as described, patterned wiring 70 is protected with covering conductor 90 in part over the terminal portion 75. In addition, surface 95 of covering conductor 90 is formed smooth because the covering conductor 90 contains the carbon particles having particle diameters finer than the silver particles. As a result, this structure can prevent silver migration from patterned wiring 70, and decrease a contact resistance in connection to an external apparatus because of an increase in surface area of the connection. Any material serviceable for the ordinary wiring board can be used for substrate 65, including a substrate of comparatively hard material such as epoxy resin mixed with glass fiber, ceramic plate and glass plate, or a film sheet substrate made of polymeric resin such as polyester resin like polyethylene terephthalate (PET), acrylonitrile butadiene styrene (ABS) resin, polycarbonate, polyimide, and the like. A substrate made of a film sheet is desirable among those materials in respect of effectiveness for reducing thickness of an electronic device that uses such a wiring board, since it is inexpensive as widely used general-purpose plastic, and the thickness can be reduced to 100 µm to 400 µm. A material suitable as the silver paste may be made of a binding agent mixed dispersively with silver particles. In particular, silver paste of a type that uses such thermosetting resins as polyester resin, epoxy resin, acrylic resin, polyimide resin, polyurethane resin and the like for the binding agent is suitable because it has good bonding strength with the substrate of the film sheet, and it increases a mechanical strength of patterned wiring 70 itself. A material suitable as the carbon paste may be made of a binding agent mixed dispersively with fine particles of electrically conductive carbon, and that the carbon particles have smaller diameters than those of the silver particles used in the silver paste. If the silver particles used for the silver paste are any of spherical shape and scaly shape having particle diameters of 0.5 µm to 10 µm, for example, it is desirable that carbon particles have approx. 0.1 µm to 1 µm in diameter, and 0.3 µm or smaller is even more desirable. Surface 95 of covering conductor 90 having a smooth texture can be realized easily by stencil-printing the carbon paste of such particle diameters over patterned wiring 70. To help facilitate the stencil printing, it is necessary to properly adjust viscosity of the carbon paste according to the printing conditions. It is also desirable to use carbon paste comprising a binding agent made of thermosetting resin such as polyester resin, epoxy resin, acrylic resin, polyimide resin, polyurethane resin and the like because of the property of good bonding strength with the silver paste, superior resistance to moisture and water, as well as outstanding resistance to abrasion.

Figure 7A:
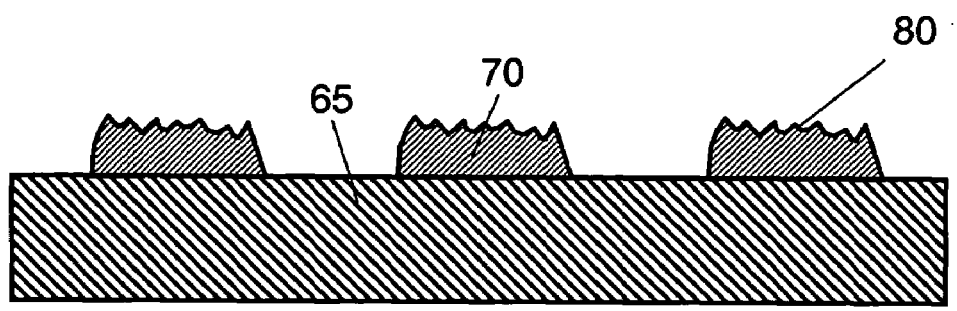
FIGS. 7A, 7B and 7C are sectional views of a wiring board showing one example of a manufacturing process according to the second exemplary embodiment of the present invention.
Figure 7B:
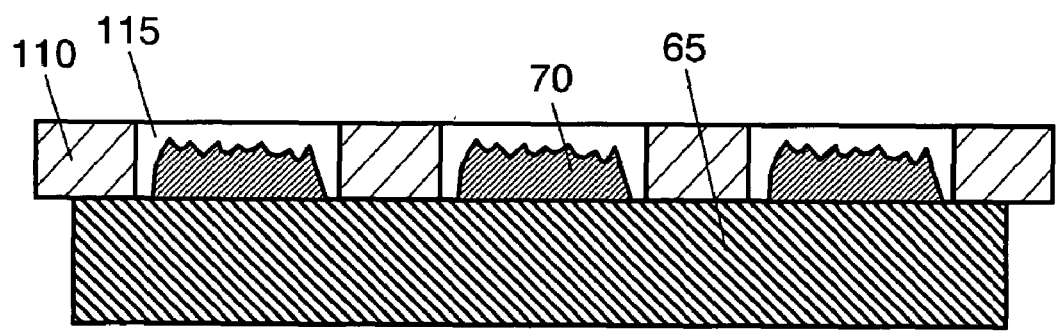
Figure 7C:
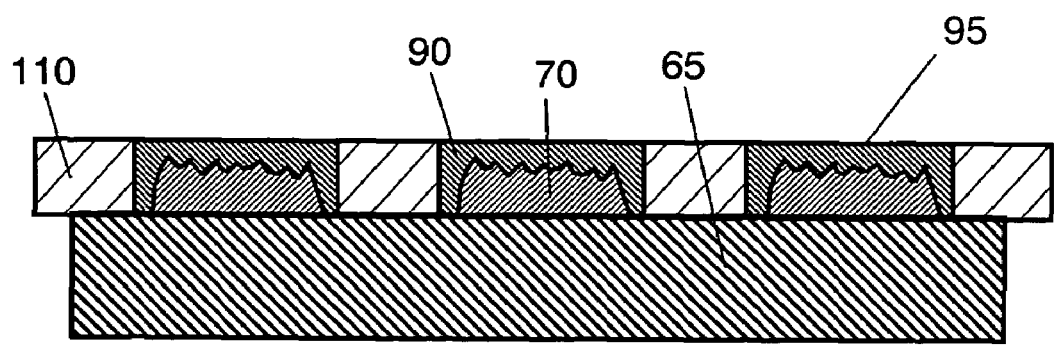
Figure 8:
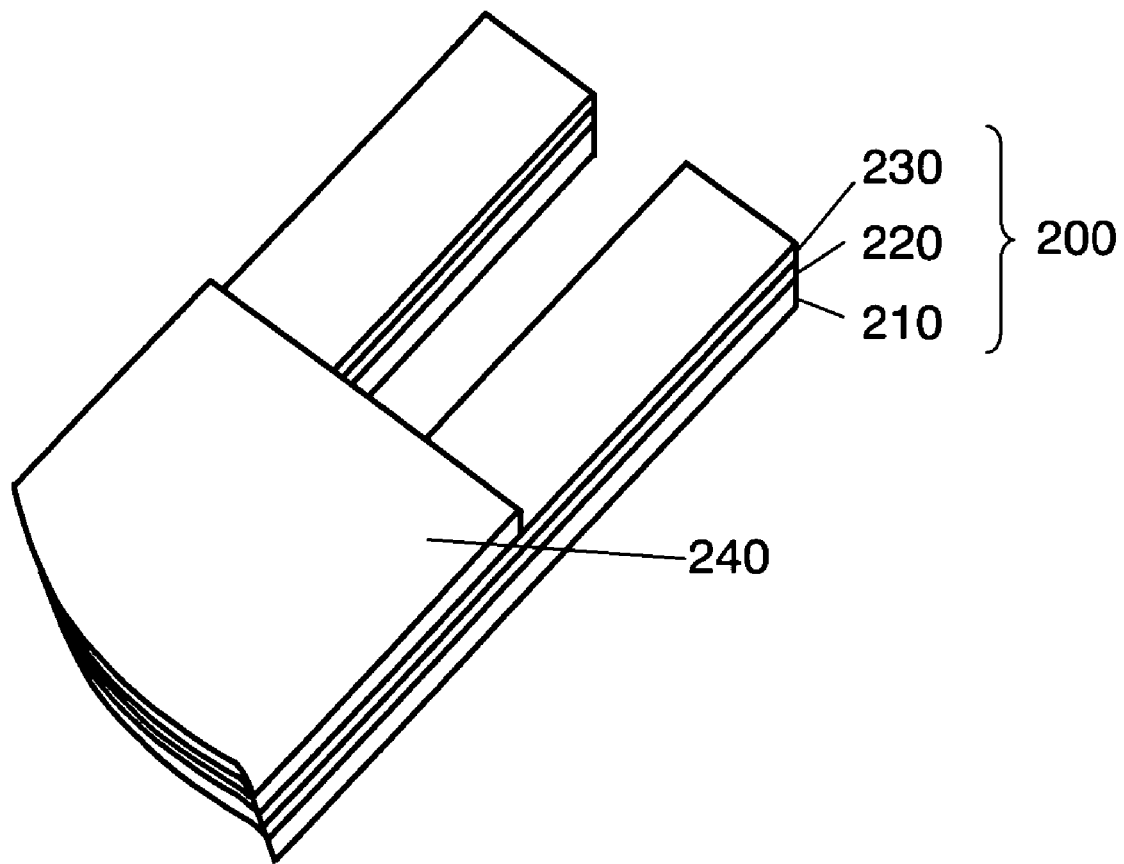
FIG. 8 is a perspective view showing a structure of a terminal portion for connection to an external apparatus in a conventional wiring board.

Referring to FIGS. 7A-7C, description is provided hereinafter of a method of manufacturing the wiring board according to the second exemplary embodiment of this invention.

FIGS. 7A-7C show sectional views of a wiring board illustrating one example of the manufacturing method, and they show a terminal portion of the wiring board as sectioned along a line X-X of FIG. 6. First, the silver paste is printed on substrate 65 by using such a printing method as the screen printing and photogravure, as shown in FIG. 7A. The silver paste is then hardened by drying or heating to form patterned wiring 70 of a low resistance and a high strength of bonding (this process is called a patterned wiring forming step).

During this step, there forms relatively large asperities measuring several µm to several tens of µm in surface 80 of patterned wiring 70, as shown in FIG. 7A. They occur due to variation in printing thickness caused by a shape of screen meshes used for the screen printing and lack of uniformity in size and shape of the silver particles of the silver paste.

Next, stencil 110 is placed in a position that opening 115 is in alignment with patterned wiring 70, as shown in FIG. 7B. Stencil 110 used in this step has a thickness larger than that of patterned wiring 70. In addition, opening 115 of stencil 110 is formed into such a shape that it encompasses patterned wiring 70 without letting the patterned wiring 70 project above it. The carbon paste containing carbon particles finer than those of the silver particles is then printed on patterned wiring 70 inside opening 115 of stencil 110 as shown in FIG. 7C. Subsequently, the carbon paste is hardened by heating or drying after removal of stencil 110 to complete wiring board 60 having terminal portion 75 covered with covering conductor 90 having smooth surface 95 and formed of the carbon paste as shown in FIG. 5 (this process is called a covering conductor forming step).

Next, insulation protective film 100 is formed over an entire area of patterned wiring 70 other than terminal portion 75 as shown in FIG. 6. This insulation protective film 100 is formed so that it partially overlaps with terminal portion 75. Insulation protective film 100 may be formed of any of an insulating plastic material such as polyimide resin, an inorganic material such as silicon dioxide, silicon nitride and the like. It may also be a double-layered structure composed of an inorganic material and a resin material. The above steps thus provide wiring board 60 having terminal portion 75 of patterned wiring 70 covered with covering conductor 90 composed of the carbon paste, as shown in FIG. 5 and FIG.

6. As described, this invention can produce wiring board 60, which has patterned wiring 70 protected with covering conductor 90 of carbon paste and terminal portion 75 provided with smoothed surface 95. Accordingly, the invention can easily realize wiring board 60 at low-cost with high productivity, while also achieving high reliability as it prevents silver migration and decreases the contact resistance.

In this second exemplary embodiment of the invention, although the covering conductor was illustrated as having the covering conductor formed on the patterned wiring after hardening the silver paste of the patterned wiring, the invention should not be considered limited to this structure. For example, both the silver paste and the carbon paste may be hardened simultaneously after completing formation up to the covering conductor.

Moreover, although the insulation protective film was illustrated as being formed after formation of the covering conductor on the terminal portion in the second exemplary embodiment of this invention, the invention should not be considered limited only to this structure. For example, the covering conductor may be formed on the terminal portion by using the stencil after formation of the insulation protective film. In this case, it is desirable that the covering conductor is formed in a manner to partially cover the insulation protective film.

Description is provided hereinafter of further details of the method of manufacturing the wiring board based on an example embodied according to the second exemplary embodiment of this invention.

In this embodiment, a patterned wiring composed of silver paste was printed on a substrate under the following conditions. Substrate 65 used here was a film of polyethylene terephthalate ("PET") having a thickness of 100 μm and a softening temperature of 130 deg-C. The silver paste used was a paste comprising a mixture of silver particles and a binding agent of thermosetting epoxy having a curing temperature of 120 deg-C., in a ratio of 75 to 15 by weight, wherein the mixed silver particles include spherical particles and scaly particles having diameters ranging between 0.5 μm and 10 μm. A screen printing method was used for printing the silver paste with screen meshes of 25 μm in diameter and a photosensitive emulsion layer of 10 μm in thickness in order to form a patterned wiring having conductors of 150 μm wide.

The silver paste was then hardened thermally to complete formation of patterned wiring 70. As a result of this process, patterned wiring 70 has 20 μm to 30 μm in thickness, 160 μm to 170 μm in width of the conductors and approximately 10 μm in height of asperities of surface 80.

Next, carbon paste was printed to form covering conductor 90 on terminal portion 75 of patterned wiring 70 according to the following conditions. The carbon paste used here was a paste comprising electrically conductive carbon particles made of acetylene black having 0.1 μm to 0.3 μm in diameter and a binding agent of thermosetting epoxy resin having 120 deg-C. in curing temperature, in a ratio of 85 to 15 by weight. A stencil printing method was used for printing the carbon paste. Stencil 110 used here was 50 μm in thickness, and it had opening 115 of a shape to completely encompass terminal portion 75 of patterned wiring 70. After the printing of the carbon paste, it was thermally hardened by heating substrate 65 at 130 deg-C. for 10 minutes. This completed wiring board 60, of which terminal portion 75 of patterned wiring 70 is covered with covering conductor 90 formed of the hardened carbon paste. After the hardening, a film thickness of terminal portion 75 was measured as 45 μm to 50 μm and there was no more than 2 μm in asperities in surface 95 of the covering conductor 90.

In addition, insulation protective film 100 was formed on a portion of patterned wiring 70 not covered with covering conductor 90, to ensure resistance to moisture and water. This insulation protective film 100 was formed by screen-printing a resin used generally as a resist film in the process of plating and the like.

Wiring board 60 manufactured by the above method was evaluated for its reliability according to the following conditions. The evaluation was performed by observing the surface of wiring board 60 left for 1,000 hours in an atmosphere of 65 deg-C. and 95% in temperature and relative humidity while having a voltage applied. The result did not show any trace of silver migration.

Furthermore, a terminal portion for external connection of the patterned wiring was mechanically connected with a terminal of an external apparatus, and contact resistance was measured. The result showed a reduction of the contact resistance by a factor of about ten as compared with a terminal portion of the conventional structure, indicating that this embodiment can substantially reduce the contact resistance.

In the second exemplary embodiment of this invention, although the insulation protective film of plating resist was formed in an area of the patterned wiring not covered with the covering conductor, the invention should not be considered limited to this structure. In other words, the insulation protective film may be formed of a film sheet of polyimide by using adhesive, or an inorganic material by means of sputtering, chemical vapor deposition (CVD) and the like method. Or, the protective film need not be formed depending on the environment of use.

Moreover, although the wiring board was illustrated as having the covering conductor formed only on the terminal portion of the exposed patterned wiring, according to the second exemplary embodiment of this invention, it may be formed on the entire exposed surface of the patterned wiring.

It is needless to mention that any of the features described in the above exemplary embodiments are applicable to each other between them.

The wiring board of this invention can demonstrate its advantageous features effectively when used in a portable terminal or the like apparatus. This is because the wiring board is compact and thin in profile, and provided with the means to protect against moisture and to prevent migration, which provides a good result. The wiring board is also useful since the patterned wiring is unlikely to separate so easily even if deformed, and no increase in the contact resistance and the like occurs.

What is claimed is:

1. A wiring board comprising:
   a sheet substrate;
   a patterned wiring formed of electrically conductive resin containing silver particles, the patterned wiring being embedded into the sheet substrate in a manner such that at least an upper surface thereof is exposed above the sheet substrate, and the upper surface having a smooth texture; and
   a covering conductor formed of electrically conductive resin containing carbon in a manner to cover the exposed surface of the patterned wiring.

2. The wiring board according to claim 1, wherein the covering conductor is formed only in an area serving a terminal portion for connection with an external apparatus within the exposed surface of the patterned wiring.

3. The wiring board according to claim 1, wherein the sheet substrate is formed of thermoplastic resin.

4. The wiring board according to claim 1, wherein
said patterned wiring includes a terminal portion for connection with a terminal of an external device; and
said covering conductor is disposed to cover the exposed surface of the patterned wiring in such a manner that said covering conductor covers at least said terminal portion of said patterned wiring.

5. The wiring board according to claim 1, wherein the sheet substrate is formed of an insulator material.

* * * * *